United States Patent
Vamshi et al.

(10) Patent No.: US 10,031,169 B2
(45) Date of Patent: Jul. 24, 2018

(54) APPARATUS AND METHOD FOR DETECTING PHASE LOCK IN AN ELECTRONIC DEVICE

(71) Applicant: Samsung Electronics Co., Ltd., Gyeonggi-do (KR)

(72) Inventors: Manthena Vamshi, Gyeonggi-do (KR); Jong-Woo Lee, Seoul (KR); Thomas Byunghak Cho, Gyeonggi-do (KR); Byung-Ki Han, Incheon (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/004,497

(22) Filed: Jan. 22, 2016

(65) Prior Publication Data
US 2016/0216300 A1 Jul. 28, 2016

(30) Foreign Application Priority Data

Jan. 22, 2015 (KR) .......................... 10-2015-0010598

(51) Int. Cl.
*G01R 25/00* (2006.01)
*H03L 7/095* (2006.01)

(52) U.S. Cl.
CPC .............. *G01R 25/00* (2013.01); *H03L 7/095* (2013.01)

(58) Field of Classification Search
CPC .......... G01R 23/12; G01R 23/15; H03L 7/095
See application file for complete search history.

(56) References Cited

U.S. PATENT DOCUMENTS

| 5,055,800 | A | * | 10/1991 | Black | H03L 7/183 327/105 |
|---|---|---|---|---|---|
| 5,337,022 | A | | 8/1994 | Pritchett | |
| 7,154,344 | B2 | | 12/2006 | Thies et al. | |
| 2002/0136339 | A1 | * | 9/2002 | Schulz | H04B 7/185 375/371 |
| 2007/0120612 | A1 | | 5/2007 | Fu | |
| 2009/0261874 | A1 | | 10/2009 | Lin | |
| 2010/0052752 | A1 | * | 3/2010 | Lee | H03L 7/095 327/159 |
| 2013/0307596 | A1 | | 11/2013 | Wang et al. | |
| 2014/0240003 | A1 | | 8/2014 | Buch et al. | |

FOREIGN PATENT DOCUMENTS

| JP | 2011160355 | 8/2011 |
|---|---|---|
| KR | 20010005039 | 1/2001 |
| KR | 102008-0024032 | 3/2008 |
| KR | 1020080077515 | 8/2008 |

* cited by examiner

*Primary Examiner* — Noam Reisner
(74) *Attorney, Agent, or Firm* — The Farrell Law Firm, P.C.

(57) ABSTRACT

The present disclosure provides a method and a phase lock detection apparatus for detecting whether a phase of an output signal is locked to the phase of a reference signal. The apparatus includes a first divider that individually frequency-divides first and second pulse signals, a phase frequency detector that outputs third and fourth pulse signals that correspond to a phase difference between the frequency-divided first and second pulse signals, a second divider that individually frequency-divides the third and fourth pulse signals, and a determiner that determines whether a phase of the second pulse signal is locked, based on the frequency-divided third and fourth pulse signals.

20 Claims, 9 Drawing Sheets

APPARATUS AND METHOD FOR DETECTING PHASE LOCK IN AN ELECTRONIC DEVICE

PRIORITY

This application claims priority under 35 U.S.C. § 119(a) to Korean Application Serial No. 10-2015-0010598, which was filed in the Korean Intellectual Property Office on Jan. 22, 2015, the contents of which are incorporated herein by reference.

BACKGROUND

1. Field of the Disclosure

The present disclosure relates to a method and a phase lock detection apparatus for detecting whether a phase is locked in an electronic device.

2. Description of the Related Art

The term "oscillator" refers to a module that generates a signal having a predetermined frequency. Oscillators can be used in various electronic devices and include low and high frequency oscillators, based on oscillation frequency. The use of high frequency oscillators is steadily increasing, such as for handling high frequency signals for wireless communication and broadcasting.

When the oscillator is used in these instances, an accurate oscillation frequency intended by a user needs to be output from the oscillator, and a phase of a signal, which is output from the oscillator, also needs to be locked to the phase of a particular reference signal. Accordingly, in order for the oscillator to output a signal having an accurate frequency according to the user's intention and the locked phase, there is a need in the art for a method and apparatus for detecting whether the phase of the output signal is locked.

SUMMARY

The present disclosure has been made to address the above-mentioned problems and disadvantages, and to provide at least the advantages described below.

Accordingly, an aspect of the present disclosure is to provide a method and a phase lock detection apparatus for detecting whether a phase is locked in an electronic device.

Another aspect of the present disclosure is to provide a method and a phase lock detection apparatus for detecting whether a phase is locked on the basis of an input reference signal.

Another aspect of the present disclosure is to provide a method and a phase lock detection apparatus which frequency-divide a reference signal and an input signal and detect whether a phase of the input signal is locked.

Another aspect of the present disclosure is to provide a method and a phase lock detection apparatus which perform two frequency divisions of a reference signal and an input signal and detect whether a phase of the input signal is locked.

Another aspect of the present disclosure is to provide a method and a phase lock detection apparatus for detecting whether a phase of an input signal is locked on the basis of a phase difference between a frequency-divided reference signal and a frequency-divided input signal.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION OF EMBODIMENTS OF THE DISCLOSURE

Figure 1:
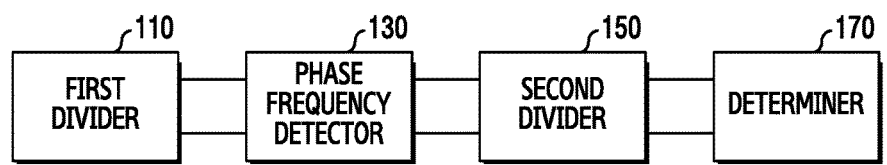
FIG. 1 illustrates a configuration of a phase lock detection apparatus according to an embodiment of the present disclosure.

Embodiments of the present disclosure will be described in detail with reference to the accompanying drawings. In describing the present disclosure, a detailed description of related known configurations or functions incorporated herein will be omitted for the sake of clarity and conciseness. Then, terms described later are defined in consideration of the functions of the present disclosure, but may vary according to the intention or convention of a user or operator. Therefore, the definitions of the terms should be determined based on the contents throughout the specification.

The present disclosure may have various embodiments, and modifications and changes may be made therein. Therefore, the present disclosure will be described in detail with reference to particular embodiments shown in the accompanying drawings. However, it should be understood that there is no intent to limit various embodiments of the present disclosure to the particular embodiments disclosed, and the present disclosure should be construed to cover all modifications, equivalents, and alternatives falling within the spirit and scope of the various embodiments of disclosure. In connection with descriptions of the drawings, similar components are designated by the same reference numeral.

As used in various embodiments of the present disclosure, the expressions "include", "may include" and other conjugates refer to the existence of a corresponding disclosed function, operation, or constituent element, and do not limit one or more additional functions, operations, or constituent elements. Further, as used in various embodiments of the present disclosure, the terms "include", "have", and their conjugates are intended merely to denote a certain feature, numeral, step, operation, element, component, or a combination thereof, and should not be construed to initially exclude the existence of or a possibility of addition of one or more other features, numerals, steps, operations, elements, components, or combinations thereof.

Further, as used in various embodiments of the present disclosure, the expression "or" includes any or all combinations of words enumerated together. For example, the expression "A or B" may include A, B, or both A and B.

While expressions including ordinal numbers, such as "first" and "second", as used in various embodiments of the present disclosure may modify various constituent elements, such constituent elements are not limited by the above expressions. For example, the above expressions do not limit the sequence and/or importance of the elements. The expressions may be used to distinguish a component element from another component element. For example, a first user device and a second user device indicate different user devices although both of them are user devices. For example, a first constituent element may be referred to as a second constituent element, and likewise a second constituent element may also be referred to as a first constituent element without departing from the scope of various embodiments of the present disclosure.

It should be noted that if it is described that one component element is "coupled" or "connected" to another component element, the first component element may be directly coupled or connected to the second component, and a third component element may be "coupled" or "connected" between the first and second component elements. Conversely, when one component element is "directly coupled" or "directly connected" to another component element, it may be construed that a third component element does not exist between the first component element and the second component element.

The terms as used in various embodiments of the present disclosure are merely for the purpose of describing particular embodiments and are not intended to limit the various embodiments of the present disclosure. As used herein, the singular forms are intended to include the plural forms as well, unless the context clearly indicates otherwise.

Unless defined otherwise, all terms used herein, including technical terms and scientific terms, have the same meaning as commonly understood by a person of ordinary skill in the art to which various embodiments of the present disclosure pertain. Such terms as those defined in a generally used dictionary are to be interpreted to have the same meanings as the contextual meanings in the relevant field of art, and are not to be interpreted to have excessively formal meanings unless clearly defined in various embodiments of the present disclosure.

Terms used herein of individual units which form a structure of the disclosed phase lock detection apparatus, and a term of a network device which may include the phase lock detection apparatus, are for convenience of description. Accordingly, embodiments of the present disclosure are not limited to the terms set forth below, and another term referring to an object having equivalent technical meaning may be used.

In accordance with an aspect of the present disclosure, an apparatus for detecting phase lock includes a first divider that individually frequency-divides a first pulse signal and a second pulse signal, a phase frequency detector that outputs a third pulse signal and a fourth pulse signal that correspond to a phase difference between the frequency-divided first pulse signal and the frequency-divided second pulse signal, a second divider that individually frequency-divides the third pulse signal and the fourth pulse signal, and a determiner that determines whether a phase of the second pulse signal is locked to match the phase of the first pulse signal, based on the frequency-divided third pulse signal and the frequency-divided fourth pulse signal.

In accordance with another aspect of the present disclosure, a method for detecting phase lock includes individually frequency-dividing a first pulse signal and a second pulse signal, outputting a third pulse signal and a fourth pulse signal that correspond to a phase difference between the frequency-divided first pulse signal and the frequency-divided second pulse signal, individually frequency-dividing the third pulse signal and the fourth pulse signal, and determining whether a phase of the second pulse signal is locked to match the phase of the first pulse signal, based on the frequency-divided third pulse signal and the frequency-divided fourth pulse signal.

In accordance with another aspect of the present disclosure, a wireless communication device includes a chip set, wherein the chip set comprises a Radio Frequency (RF) processing unit that includes a Phase-Locked Loop (PLL), and a phase lock detection unit that detects whether a phase of an output signal of the PLL is locked to match the phase of a reference signal, and wherein the phase lock detection unit comprises a first divider that frequency-divides the reference signal and the output signal, a phase frequency detector that outputs a first pulse signal and a second pulse signal that correspond to a phase difference between the frequency-divided reference signal and the frequency-divided output signal, a second divider that frequency-divides the first pulse signal and the second pulse signal, and a determiner that determines whether the phase of the output signal is locked, based on the frequency-divided first pulse signal and the frequency-divided second pulse signal.

In accordance with another aspect of the present disclosure, a method of executing operations by a chip set comprises individually frequency-dividing a reference signal and an output signal, outputting a first pulse signal and a second pulse signal that correspond to a phase difference between the frequency-divided reference signal and the frequency-divided output signal, individually frequency-dividing the first pulse signal and the second pulse signal, and determining whether a phase of the output signal is locked to match a phase of the reference signal, based on the frequency-divided first pulse signal and the frequency-divided second pulse signal.

FIG. 1 illustrates a configuration of a phase lock detection apparatus according to an embodiment of the present disclosure.

The phase lock detection apparatus is for detecting whether a phase of a particular signal has been locked to the phase of a reference signal, and may be included in a wireless communication system. Specifically, the phase lock detection apparatus may be included in a device, such as a Radio Frequency Integrated Circuit (RFIC) or a modulator/demodulator (modem chip set), which may be included in the wireless communication system.

Referring to FIG. 1, the phase lock detection apparatus includes a first divider 110, a phase frequency detector 130, a second divider 150, and a determiner 170. The first divider 110 divides a frequency of a signal that is input to the first divider 110, and the second divider 150 divides a frequency of a signal that is input to the second divider 150. The phase frequency detector 130 calculates a phase difference between signals which are input to the phase frequency detector 130, and generates a difference signal corresponding to the phase difference. The determiner 170 determines whether a signal that has been input to the phase lock detection apparatus is frequency-locked.

The phase lock detection apparatus includes the first divider 110 that individually frequency-divides a first pulse signal and a second pulse signal, the phase frequency detector 130 that outputs a third pulse signal and a fourth pulse signal each corresponding to a phase difference between the frequency-divided first pulse signal and the frequency-divided second pulse signal, the second divider 150 that individually frequency-divides the third pulse signal and the fourth pulse signal, and the determiner 170 that determines whether a phase of the second pulse signal is locked on the basis of the frequency-divided third pulse signal and the frequency-divided fourth pulse signal.

The first pulse signal and the second pulse signal are individually input to the first divider 110. The first pulse signal is referred to herein as a "reference signal". The reference signal may be generated by an oscillator, such as the TCXO having higher stability than the stability of other oscillators. According to an embodiment of the present disclosure, the second pulse signal is the signal used by the phase lock detection apparatus to detect whether a phase is locked. For example, the second pulse signal includes a signal that is output from a Voltage-Controlled Oscillator (VCO). Accordingly, the second pulse signal is referred to herein as an "output signal."

Further, in the above-described example, a Phase-Locked Loop (PLL) may be used to lock a phase of a signal that is output from the VCO. The PLL detects a phase difference between the reference signal and the output signal from the PLL, and controls the phase of the signal, which is output from the VCO, on the basis of the detected phase difference. As a result, the PLL causes the phase of the output signal to coincide with the phase of the reference signal. Therefore, according to an embodiment of the present disclosure, after the second pulse signal is output from a particular oscillator, the second pulse signal passes through the PLL.

In FIG. 1, each of the first divider 110 and the second divider 150 refers to a circuit that divides a frequency in order to match a frequency of a high-speed circuit part with the frequency of a low-speed circuit part. In other words, the first divider 110 and the second divider 150 are used to obtain a wide pulse width. According to an embodiment of the present disclosure, the first divider 110 and the second divider 150 serve to reduce a frequency of both the reference signal and the output signal by a predetermined ratio in order to easily detect whether the phase of the output signal is locked to the phase of the reference signal. In other words, "locked to" refers to the phase of the output signal being the same as or matching the phase of the reference signal.

The first divider 110 outputs the frequency-divided versions of the first pulse signal and the second pulse signal, which are both input to the first divider 110, to the phase frequency detector 130. The frequency-divided version of the reference signal that is output from the first divider 110 has a wavelength that is twice as long as the wavelength of the reference signal that is input to the first divider 110.

Similarly, the frequency-divided output signal that is output from the first divider 110 has a wavelength that is twice as long as the wavelength of the output signal which is input to the first divider 110. When a duty cycle of the second pulse signal that is input to the first divider 110 does not reach 50%, the first divider 110 corrects the second pulse signal such that the duty cycle of the second pulse signal reaches 50%, and outputs the corrected second pulse signal.

The phase frequency detector 130 outputs a third pulse signal and a fourth pulse signal each corresponding to a phase difference between the frequency-divided first pulse signal and the frequency-divided second pulse signal. In other words, the phase frequency detector 130 quantifies the phase difference between the frequency-divided first pulse signal and the frequency-divided second pulse signal, and outputs the third pulse signal and the fourth pulse signal each corresponding to the quantified phase difference.

The phase frequency detector 130 individually outputs, as a reference, the third pulse signal corresponding to a period during which the amplitude of the first pulse signal is higher than the amplitude of the second pulse signal at a time point, and the fourth pulse signal corresponding to a period during which the amplitude of the second pulse signal is higher than the amplitude of the first pulse signal at a time point, when a phase difference between the first pulse signal and the second pulse signal begins to exist. A specific operation of the phase frequency detector 130 will be described in detail below with reference to FIG. 2.

The second divider 150 frequency-divides the third pulse signal and the fourth pulse signal, both of which are input to the second divider 150, and outputs the frequency-divided third and fourth pulse signals to the determiner 170. The frequency-divided third pulse signal that is output from the second divider 150 has a wavelength that is twice as long as the wavelength of the third pulse signal which is input to the second divider 150. When a duty cycle of the third pulse signal that is input to the second divider 150 does not reach 50%, the second divider 150 corrects the third pulse signal such that the duty cycle of the third pulse signal reaches 50%, and outputs the corrected third pulse signal to the determiner 170.

The frequency-divided fourth pulse signal, which is output from the second divider 150, has a wavelength that is twice as long as the wavelength of the fourth pulse signal which is input to the second divider 150. When a duty cycle of the fourth pulse signal that is input to the second divider 150 does not reach 50%, the second divider 150 corrects the fourth pulse signal such that the duty cycle of the fourth pulse signal reaches 50%, and outputs the corrected fourth pulse signal to the determiner 170.

The determiner 170 determines whether the phase of the second pulse signal is locked, on the basis of the frequency-divided third pulse signal and the frequency-divided fourth pulse signal. In other words, the determiner 170 determines whether a phase difference exists between the frequency-divided third pulse signal and the frequency-divided fourth pulse signal by comparing the two signals. When the phase difference does not exist, the determiner 170 determines that the phase of the second pulse signal has been locked to the phase of the first pulse signal. In contrast, when the phase difference exists, the determiner 170 determines that the phase of the second pulse signal has not been locked to the phase of the first pulse signal.

Figure 2:
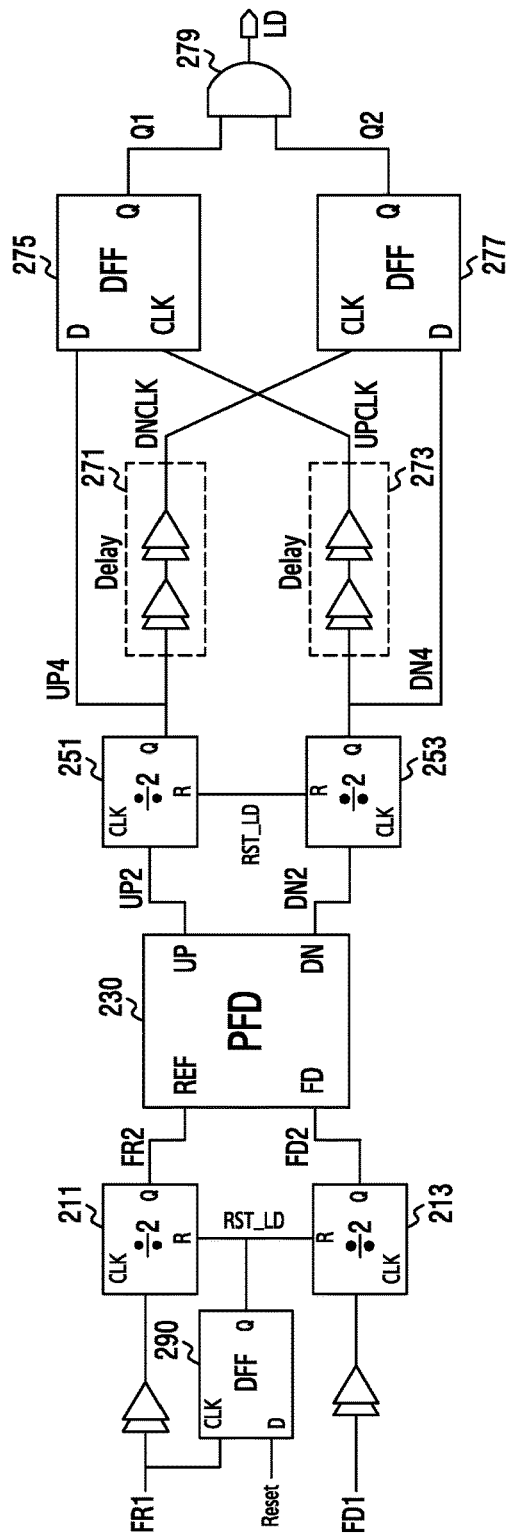
FIG. 2 illustrates a configuration of a phase lock detection apparatus according to an embodiment of the present disclosure.

FIG. 2 illustrates a configuration of a phase lock detection apparatus according to an embodiment of the present disclosure.

Referring to FIG. 2, the phase lock detection apparatus includes a first reference signal divider 211, a first output signal divider 213, a phase frequency detector (PFD) 230, a second reference signal divider 251, a second output signal divider 253, a first delay circuit 271, a second delay circuit 273, a first flip-flop 275, a second flip-flop 277, an AND gate 279, and a third flip-flop 290. Each of the first flip-flop 275, the second flip-flop 277 and the third flip-flop 290 includes a Delay flip-flop (DFF).

The first reference signal divider 211 and the first output signal divider 213 may be included in the first divider 110 illustrated in FIG. 1. The phase frequency detector 230 may correspond to the phase frequency detector 130 illustrated in FIG. 1. The second reference signal divider 251 and the second output signal divider 253 may be included in the second divider 150 illustrated in FIG. 1. The first delay circuit 271, the second delay circuit 273, the first flip-flop 275, the second flip-flop 277 and the AND gate 279 may be included in the determiner 170 illustrated in FIG. 1.

In addition, the first reference signal divider 211 is referred to herein as a "first reference divider," the first output signal divider 213 is referred to herein as a "first output divider," the second reference signal divider 251 is referred to herein as a "second reference divider," and the second output signal divider 253 is referred to herein as a "second output divider." The first flip-flop 275 is referred to herein as a "first determiner," the second flip-flop 277 is referred to herein as a "second determiner," and the AND gate 279 is referred to herein as a "third determiner."

Specifically, signal FR1 is individually input to the first reference signal divider 211, and signal FD1 is input to the first output signal divider 213. Signal FR1 is referred to herein as the "first pulse signal" or "reference signal" described above with reference to FIG. 1, and is generated by an oscillator, such as a TCXO having a higher stability than the stability of other oscillators. Signal FD1 is referred to herein as the "second pulse signal" or "output signal" described above with reference to FIG. 1, and is used by the phase lock detection apparatus to determine whether a phase is locked. For example, signal FD1 includes a signal that is output from a VCO.

In the above-described example, a PLL may also be used to lock a phase of the signal that is output from the VCO. The PLL detects a phase difference between the reference signal and the output signal that is output from the PLL, and controls the phase of the signal, which is output from the VCO, on the basis of the detected phase difference. As a result, the PLL causes the phase of the output signal to coincide with that of the reference signal. Therefore, according to an embodiment of the present disclosure, after signal FD1 is output from a particular oscillator, signal FD1 passes through the PLL.

The first reference signal divider 211 outputs the signal FR2, which is the frequency-divided version of signal FR1 that has passed through a buffer and is input to the first reference signal divider 211, to the phase frequency detector 230. The first output signal divider 213 outputs the signal FD2, which is the frequency-divided version of signal FD1 that has passed through a buffer and is input to the first output signal divider 213, to the phase frequency detector 230. The respective buffers may be omitted, and the third flip-flop 290, which is connected to both the first reference signal divider 211 and the first output signal divider 213, synchronizes the first reference signal divider 211 with the first output signal divider 213.

As described above, signal FR1 is the reference signal, and the frequency-divided reference signal FR2 which is output from the first reference signal divider 211, has a wavelength that is twice as long as the wavelength of reference signal FR1 that is input to the first reference signal divider 211. Similarly, signal FD1 is the output signal, and the frequency-divided output signal FD2 which is output from the first output signal divider 213, has a wavelength that is twice as long as the wavelength of output signal FD1 that is input to the first output signal divider 213. When a duty cycle of signal FD1 which is input to the first output signal divider 213 does not reach 50%, the first output signal divider 213 corrects signal FD1 such that the duty cycle of signal FD1 reaches 50%, and outputs the corrected signal.

The phase frequency detector 230 outputs signal UP2 and signal DN2 each corresponding to a phase difference between a signal FR2 (i.e., a signal obtained by dividing signal FR1) and a signal FD2 (i.e., a signal obtained by dividing signal FD1). In other words, the phase frequency detector 230 quantifies the phase difference between signal FR2 and signal FD2, and outputs the signal UP2 and signal DN2 each corresponding to the quantified phase difference.

The phase frequency detector 230 individually outputs signal UP2 corresponding to a period during which the amplitude of signal FR2 is higher than that of signal FD2 with a time point, when a phase difference between signal FR2 and signal FD2 begins to exist, as a reference; and signal DN2 corresponding to a period during which the amplitude of signal FD2 is higher than that of signal FR2 with the time point, when the phase difference between the signal FR2 and signal FD2 begins to exist, as the reference. A specific operation of the phase frequency detector 230 will be described in detail below in examples of FIGS. 3 to 5.

The second reference signal divider 251 frequency-divides signal UP2, which is input to the second reference signal divider 251, and outputs signal UP4 (i.e., a signal obtained by dividing signal UP2) to each of the first delay circuit 271 and the first flip-flop 275. The second output signal divider 253 frequency-divides signal DN2, which is input to the second output signal divider 253, and outputs a signal DN4 (i.e., a signal obtained by dividing signal DN2) to each of the second delay circuit 273 and the second flip-flop 277.

In this case, signal UP4 has a wavelength that is twice as long as the wavelength of signal UP2. When a duty cycle of signal UP2 does not reach 50%, the second reference signal divider 251 corrects signal UP2 such that the duty cycle of signal UP2 reaches 50%, and outputs the corrected signal. Signal DN4 has a wavelength that is twice as long as the wavelength of signal DN2. When a duty cycle of signal DN2 does not reach 50%, the second output signal divider 253 corrects signal DN2 such that the duty cycle of signal DN2 reaches 50%, and outputs the corrected signal.

The first delay circuit 271 delays signal UP4, which is input to the first delay circuit 271, and outputs the delayed signal to a clock (CLK) terminal of the second flip-flop 277. In other words, signal DNCLK which is output from the first delay circuit 271 serves as a clock signal of the second flip-flop 277. The second delay circuit 273 delays the signal DN4, which is input to the second delay circuit 273, and outputs the delayed signal to a CLK terminal of the first flip-flop 275. In other words, a signal UPCLK which is output from the second delay circuit 273 serves as a clock signal of the first flip-flop 275.

Signal UP4 is input to a data (D) terminal of the first flip-flop 275. The first flip-flop 275 outputs reference signal Q1, wherein reference signal Q1 is the value of signal UP4 which is input with signal UPCLK. Signal DN4 is input to a D terminal of the second flip-flop 277 which outputs signal Q2, wherein signal Q2 is the value of signal DN4 which is input with signal DNCLK.

Signal Q1 and signal Q2 may be individually output to the AND gate 279. The AND gate 279 refers to an element that allows an output to become a logic state of 1 only when inputs are all in a logic state of 1. According to an embodiment of the present disclosure, when logic values of signal Q1 and signal Q2 all become 1, a logic value of signal LD, which is output from the AND gate 279, may be determined as 1. In this case, the phase lock detection apparatus may finally determine that the phase of signal FD1 has been locked to that of signal FR1.

According to an embodiment of the present disclosure, when at least one of the logic values of signal Q1 and signal Q2 becomes 0, the logic value of the signal LD, which is output from the AND gate 279, may be determined as 0. In this case, the phase lock detection apparatus may finally determine that the phase of signal FD1 has not been locked to that of signal FR1.

Figure 3:
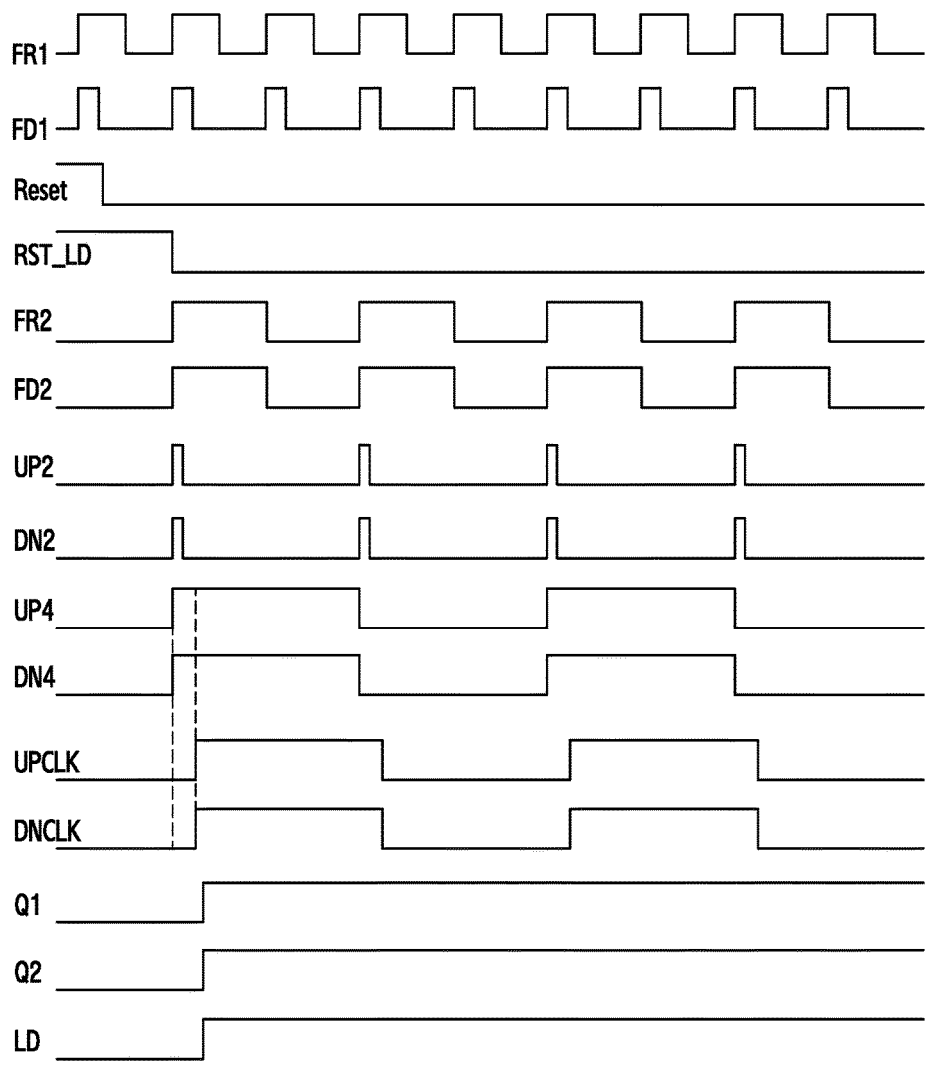
FIG. 3 illustrates a timing diagram of a phase lock detection apparatus according to embodiments of the present disclosure.

FIG. 3 illustrates a timing diagram of a phase lock detection apparatus according to embodiments of the present disclosure.

Specifically, FIG. 3 illustrates an operation of the phase lock detection apparatus when signals that are input to the phase lock detection apparatus are phase-locked to each other according to an embodiment of the present disclosure. The signals illustrated in FIG. 3 are input to the respective elements described above with reference to FIG. 2, or correspond to signals that are output from the elements, respectively.

According to an embodiment of the present disclosure, the frequency and phase of signal FR1, which is input to the first reference signal divider 211, are locked to the frequency and phase of signal FD1 which is input to the first output signal divider 213. In this case, a difference may exist between signal FR1 and signal FD1 in that a duty cycle of signal FR1 reaches 50% but a duty cycle of signal FD1 does not reach 50%.

As described above with reference to FIG. 2, the third flip-flop 290 synchronizes the first reference signal divider 211 with the first output signal divider 213. In other words, from a time point (i.e., a reset time point) when a logic value of signal RST_LD, which is an output signal of the third flip-flop 290, is changed from 1 to 0, the first reference signal divider 211 and the first output signal divider 213 output signal FR2 and signal FD2, respectively.

In FIG. 3, signal FR2 illustrates a result of dividing the frequency of signal FR1 by 2 by the first reference signal divider 211. Duty cycles of signal FR2 and signal FR1 are both equal to 50%. Signal FD2 illustrates a result of dividing the frequency of signal FD1 by 2 by the first output signal divider 213. The first output signal divider 213 corrects signal FD1 such that the duty cycle of signal FD1 becomes equal to 50%, and outputs signal FD2.

Signal UP2 may be determined by the phase frequency detector 230 as corresponding to a phase difference between signal FR2 and signal FD2 with signal FR2 as a reference at a time point when the phase difference between signal FR2 and signal FD2 exists. Signal DN2 may be determined by the phase frequency detector 230 as corresponding to a phase difference between signal FR2 and signal FD2 with signal FD2 as a reference at a time point when the phase difference between signal FR2 and signal FD2 exists. When the phase difference between signal FR2 and signal FD2 does not exist as illustrated in FIG. 3, a default signal is output at a time point when the phase of signal FR2 coincides with that of signal FD2. According to an embodiment of the present disclosure, signal UP2 and signal DN2 are in a form such that a phase of signal UP2 coincides with the phase of signal DN2.

Signal UP4 illustrates a result of dividing a frequency of signal UP2 by 2 by the second reference signal divider 251, which corrects signal UP2 such that a duty cycle of signal UP2 becomes equal to 50%, and outputs signal UP4. Signal DN4 illustrates a result of dividing a frequency of signal DN2 by 2 by the second output signal divider 253, which corrects signal DN2 such that a duty cycle of signal DN2 becomes equal to 50%, and outputs signal DN4.

As a result, signal UP4 and signal DN4 are in a form such that a phase of signal UP4 coincides with the phase of signal DN4. Signal UP4 has a wavelength and a pulse width twice as long as the wavelength and pulse width of signal UP2. Signal DN4 has a wavelength and a pulse width twice as long as the wavelength and pulse width of signal DN2.

Signal UPCLK is obtained by delaying signal DN4 by a particular time period by the second delay circuit 273. Signal DNCLK is obtained by delaying signal UP4 by a particular time period by the first delay circuit 271. The particular time period may be determined as a predetermined time period, and will be described in detail below with reference to FIG. 7.

The first flip-flop 275 outputs the value of signal UP4 at each leading edge of signal UPCLK which is input to the first flip-flop 275. For example, a logic value of signal UP4 is equal to 1 at the first leading edge of signal UPCLK, and thus the first flip-flop 275 outputs the logic value of 1 as signal Q1 until the second leading edge of signal UPCLK. According to this principle, signal Q1 continuously maintains the logic value of 1 after the first leading edge of signal UPCLK, as illustrated in FIG. 3.

The second flip-flop 277 outputs the value of signal DN4 at each leading edge of signal DNCLK which is input to the second flip-flop 277. For example, a logic value of signal DN4 is equal to 1 at the first leading edge of signal DNCLK, and thus the second flip-flop 277 outputs the logic value of 1 as signal Q2 until the second leading edge of signal DNCLK. According to this principle, signal Q2 continuously maintains the logic value of 1 after the first leading edge of signal DNCLK, as illustrated in FIG. 3.

When logic values of signal Q1 and signal Q2 are both equal to 1, the AND gate 279 outputs a logic value of signal LD as 1. As illustrated in FIG. 3, from a time point when the logic value of signal LD becomes 1, the phase lock detection apparatus determines that the phase of signal FD1 has been locked.

Figure 4:
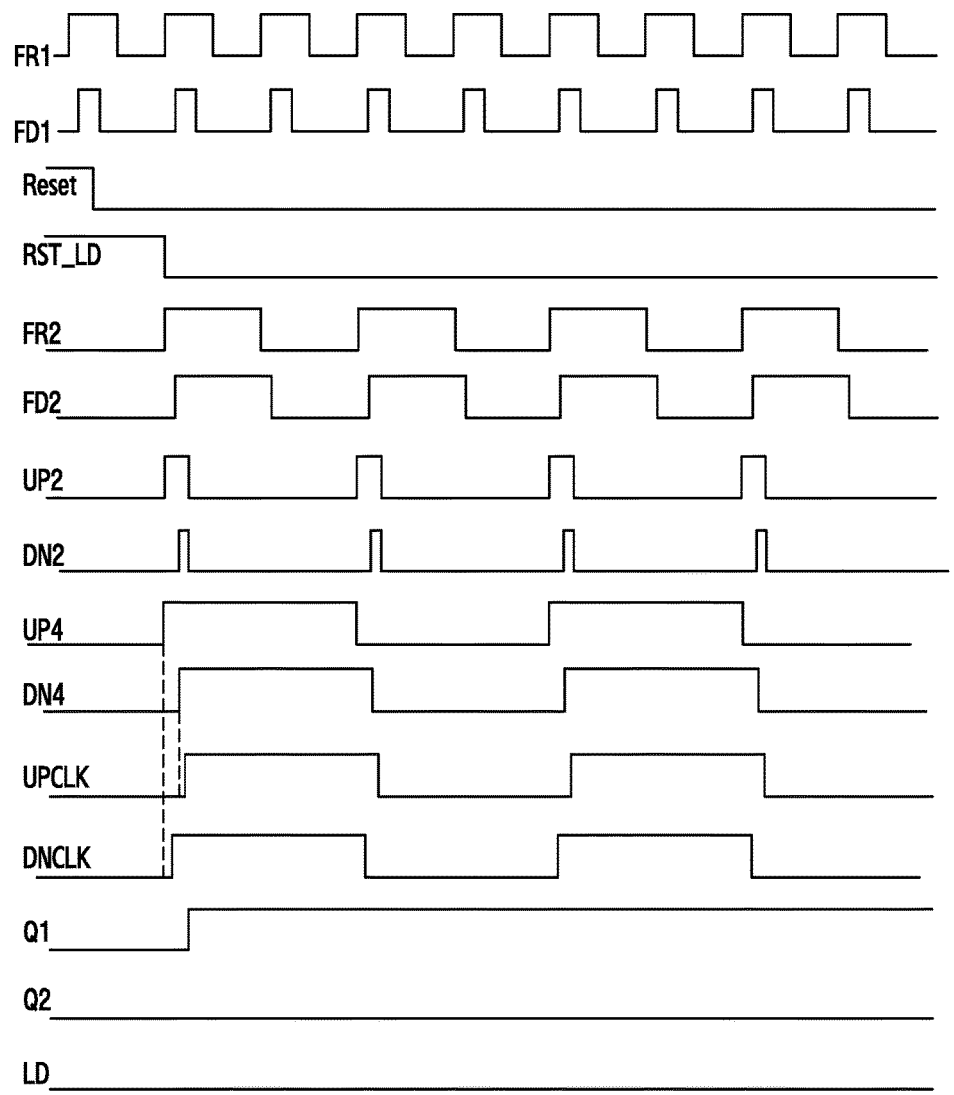
FIG. 4 illustrates a timing diagram of a phase lock detection apparatus according to embodiments of the present disclosure.

FIG. 4 illustrates a timing diagram of a phase lock detection apparatus according to embodiments of the present disclosure.

Specifically, FIG. 4 illustrates an operation of the phase lock detection apparatus when signals which are input to the phase lock detection apparatus are not phase-locked to each other according to an embodiment of the present disclosure. The signals illustrated in FIG. 4 are input to the respective elements described above with reference to FIG. 2, or correspond to signals that are output from these elements, respectively.

According to an embodiment of the present disclosure, the frequency of signal FR1, which is input to the first reference signal divider 211, may be locked to that of signal FD1 which is input to the first output signal divider 213. However, as illustrated in FIG. 4, the phase of signal FR1 may precede the phase of signal FD1. Also, a difference may exist between signal FR1 and signal FD1 in that a duty cycle of signal FR1 reaches 50% but a duty cycle of signal FD1 does not reach 50%.

As described above with reference to FIG. 2, the third flip-flop 290 synchronizes the first reference signal divider 211 with the first output signal divider 213. In other words, from a time point (i.e., a reset time point) when a logic value of signal RST_LD, which is an output signal of the third flip-flop 290, is changed from 1 to 0, the first reference signal divider 211 and the first output signal divider 213 output signal FR2 and signal FD2, respectively.

In FIG. 4, signal FR2 illustrates a result of dividing the frequency of signal FR1 by 2 by the first reference signal divider 211. Duty cycles of signal FR2 and signal FR1 are both equal to 50%. Signal FD2 illustrates a result of dividing the frequency of signal FD1 by 2 by the first output signal divider 213. The first output signal divider 213 corrects signal FD1 such that the duty cycle of signal FD1 becomes equal to 50%, and outputs signal FD2.

Signal UP2 is determined by the phase frequency detector 230 as corresponding to a phase difference between signal FR2 and signal FD2 with signal FR2 as a reference at a time point when the phase difference between signal FR2 and signal FD2 exists. Signal DN2 is determined by the phase frequency detector 230 as corresponding to a phase difference between signal FR2 and signal FD2 with signal FD2 as a reference at a time point when the phase difference between signal FR2 and signal FD2 exists.

According to an embodiment of the present disclosure, as illustrated in FIG. 4, a phase of signal FR2 does not coincide with that of signal FD2 with a first leading edge of signal FR2 as a reference. Signal UP2 is determined as corresponding to a phase difference between signal FR2 and signal FD2 with the first leading edge of signal FR2 as the reference. Signal DN2 is determined as corresponding to a phase difference between signal FR2 and signal FD2 with a first leading edge of signal FD2 as a reference.

Signal UP4 illustrates a result of dividing a frequency of signal UP2 by 2 by the second reference signal divider 251, which corrects signal UP2 such that a duty cycle of signal UP2 becomes equal to 50%, and outputs signal UP4. Signal DN4 illustrates a result of dividing a frequency of signal DN2 by 2 by the second output signal divider 253. The second output signal divider 253 corrects signal DN2 such that a duty cycle of signal DN2 becomes equal to 50%, and outputs signal DN4.

As a result, a phase difference is maintained between signal UP4 and signal DN4. However, a cycle and a pulse width of signal UP4 may be determined to be longer than the cycle and pulse width of signal UP2. Similarly, a cycle and a pulse width of signal DN4 may be determined to be longer than the cycle and pulse width of signal DN2.

The signal UPCLK is obtained by delaying signal DN4 by a particular time period by the second delay circuit 273. Signal DNCLK is obtained by delaying signal UP4 by a particular time period by the first delay circuit 271. The particular time period may be determined as a predetermined time period, which will be described in detail below with reference to FIG. 7.

The first flip-flop 275 outputs the value of signal UP4 at each leading edge of signal UPCLK which is input to the first flip-flop 275. For example, a logic value of signal UP4 is equal to 1 at the first leading edge of signal UPCLK, and thus the first flip-flop 275 outputs the logic value of 1 as signal Q1 until the second leading edge of signal UPCLK. According to this principle, signal Q1 continuously maintains the logic value of 1 after the first leading edge of signal UPCLK, as illustrated in FIG. 4.

The second flip-flop 277 outputs the value of signal DN4 at each leading edge of signal DNCLK which is input to the second flip-flop 277. For example, a logic value of signal DN4 is equal to 0 at the first leading edge of signal DNCLK, and thus the second flip-flop 277 outputs the logic value of 0 as signal Q2 until the second leading edge of signal DNCLK. According to this principle, signal Q2 continuously maintains the logic value of 0 after the first leading edge of signal DNCLK, as illustrated in FIG. 4.

As further illustrated in FIG. 4, when logic values of signal Q1 and signal Q2 are both equal to 1, the AND gate 279 outputs a logic value of signal LD as 1. In other cases, the AND gate 279 outputs the logic value of signal LD as 0. As illustrated in FIG. 4, signal Q1 continuously maintains the logic value of 1 after the first leading edge of signal UPCLK, but the logic value of signal Q2 is maintained to be 0. Accordingly, as illustrated in FIG. 4, the logic value of signal LD is determined to be 0, and the phase lock detection apparatus determines that the phase of signal FD1 has not been locked.

Figure 5:
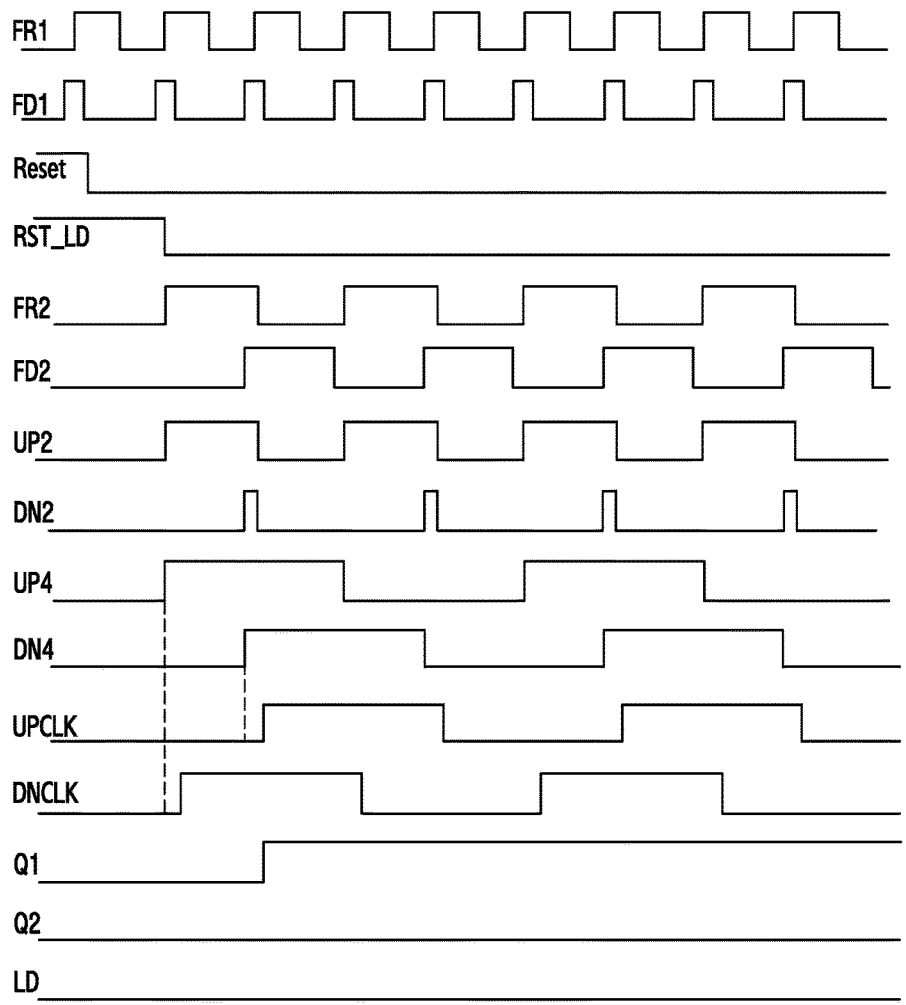
FIG. 5 illustrates a timing diagram of a phase lock detection apparatus according to embodiments of the present disclosure.

FIG. 5 illustrates a timing diagram of a phase lock detection apparatus according to embodiments of the present disclosure.

Specifically, FIG. 5 illustrates an operation of the phase lock detection apparatus when signals which are input to the phase lock detection apparatus are not phase-locked to each other according to an embodiment of the present disclosure. The signals illustrated in FIG. 5 are input to the respective elements described above with reference to FIG. 2, or correspond to signals that are output from these elements, respectively.

According to an embodiment of the present disclosure, the frequency of signal FR1, which is input to the first reference signal divider 211, is locked to that of signal FD1 which is input to the first output signal divider 213. However, as illustrated in FIG. 5, the phase of signal FD1 precedes the phase of signal FR1. Also, a difference may exist between signal FR1 and signal FD1 in that a duty cycle of signal FR1 reaches 50% but a duty cycle of signal FD1 does not reach 50%.

As described above with reference to FIG. 2, the third flip-flop 290 synchronizes the first reference signal divider 211 with the first output signal divider 213. In other words, from a time point (i.e., a reset time point) when a logic value of signal RST_LD, which is an output signal of the third flip-flop 290, is changed from 1 to 0, the first reference signal divider 211 and the first output signal divider 213 output signal FR2 and signal FD2, respectively.

In FIG. 5, signal FR2 illustrates a result of dividing the frequency of signal FR1 by 2 by the first reference signal divider 211. Duty cycles of signal FR2 and signal FR1 are both equal to 50%. Signal FD2 illustrates a result of dividing the frequency of signal FD1 by 2 by the first output signal divider 213, which corrects signal FD1 such that the duty cycle of signal FD1 becomes equal to 50%, and outputs signal FD2.

Signal UP2 is determined by the phase frequency detector 230 as corresponding to a phase difference between signal FR2 and signal FD2 with signal FR2 as a reference at a time point when the phase difference between signal FR2 and signal FD2 exists. Signal DN2 is determined by the phase frequency detector 230 as corresponding to a phase difference between signal FR2 and signal FD2 with signal FD2 as a reference at a time point when the phase difference between signal FR2 and signal FD2 exists.

According to an embodiment of the present disclosure, as illustrated in FIG. 5, a phase of signal FR2 does not coincide with that of signal FD2 with a first leading edge of signal FR2 as a reference. Signal UP2 may be determined as corresponding to a phase difference between signal FR2 and signal FD2 with the first leading edge of signal FR2 as the reference. Signal DN2 is determined as corresponding to a phase difference between signal FR2 and signal FD2 with a first leading edge of signal FD2 as a reference.

Signal UP4 illustrates a result of dividing a frequency of signal UP2 by 2 by the second reference signal divider 251. Signal DN4 illustrates a result of dividing a frequency of signal DN2 by 2 by the second output signal divider 253. In this case, the second output signal divider 253 corrects signal DN2 such that a duty cycle of signal DN2 becomes equal to 50%, and outputs signal DN4.

As a result, a phase difference is maintained between signal UP4 and signal DN4. However, a cycle and a pulse width of signal UP4 may be determined to be longer than the cycle and pulse width of signal UP2. Similarly, a cycle and a pulse width of signal DN4 may be determined to be longer than the cycle and pulse width of signal DN2.

Signal UPCLK may be obtained by delaying signal DN4 by a particular time period by the second delay circuit 273. Signal DNCLK may be obtained by delaying signal UP4 by a particular time period by the first delay circuit 271. The particular time period may be determined as a predetermined time period, which will be described in detail below with reference to FIG. 7.

The first flip-flop 275 outputs the value of signal UP4 at each leading edge of signal UPCLK which is input to the first flip-flop 275. For example, a logic value of signal UP4 is equal to 1 at the first leading edge of signal UPCLK, and thus the first flip-flop 275 outputs the logic value of 1 as signal Q1 until the second leading edge of signal UPCLK. According to this principle, signal Q1 continuously maintains the logic value of 1 after the first leading edge of signal UPCLK, as illustrated in FIG. 5.

The second flip-flop 277 outputs the value of signal DN4 at each leading edge of signal DNCLK which is input to the second flip-flop 277. For example, a logic value of signal DN4 is equal to 0 at the first leading edge of signal DNCLK, and thus the second flip-flop 277 outputs the logic value of 0 as signal Q2 until the second leading edge of signal DNCLK. According to this principle, signal Q2 continuously maintains the logic value of 0 after the first leading edge of signal DNCLK, as illustrated in FIG. 5.

As further illustrated in FIG. 5, when logic values of signal Q1 and signal Q2 are both equal to 1, the AND gate 279 outputs a logic value of signal LD as 1. In other cases, the AND gate 279 outputs the logic value of signal LD as 0. Signal Q1 continuously maintains the logic value of 1 after the first leading edge of signal UPCLK, but the logic value of signal Q2 is maintained as 0. Accordingly, as illustrated in FIG. 5, the logic value of signal LD is determined to be 0, and the phase lock detection apparatus determines that the phase of signal FD1 has not been locked.

Figure 6:
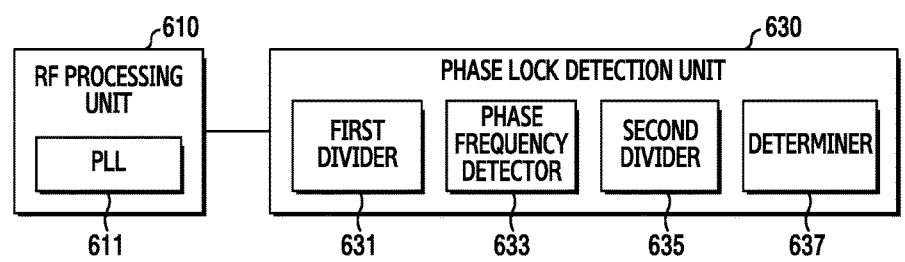
FIG. 6 illustrates a configuration of a wireless communication device according to an embodiment of the present disclosure.

FIG. 6 illustrates a configuration of a wireless communication device according to an embodiment of the present disclosure.

Referring to FIG. 6, the wireless communication device includes an RF processing unit 610 and a phase lock detection unit 630. The RF processing unit 610 includes a PLL 611, and the phase lock detection unit 630 includes a first divider 631, a phase frequency detector 633, a second divider 635, and a determiner 637.

In FIG. 6, the phase lock detection unit 630 is an element that detects whether a phase of an output signal of the PLL 611 is locked, and corresponds to the apparatus illustrated in FIG. 1. The first divider 631 corresponds to the first divider 110 illustrated in FIG. 1, the phase frequency detector 633 corresponds to the phase frequency detector 130 illustrated in FIG. 1, the second divider 635 corresponds to the second divider 150 illustrated in FIG. 1, and the determiner 637 corresponds to the determiner 170 illustrated in FIG. 1.

The RF processing unit 610 performs functions for transmitting and receiving signals through a wireless channel, such as band conversion and amplification of a signal. In other words, the RF processing unit 610 generates an RF band signal by up-converting a frequency of a baseband signal, and then transmits the RF band signal through an antenna. The RF processing unit 610 generates a baseband signal by down-converting a frequency of an RF band signal received through the antenna. For example, the RF processing unit 610 may include a transmission filter, a reception filter, an amplifier, a mixer, an oscillator, a Digital-to-Analog Converter (DAC), and an Analog-to-Digital Converter (ADC).

The RF processing unit 610 includes the PLL 611. The PLL 611 detects a phase difference between a reference signal and an output signal which are output from the PLL 611, and controls a phase of a signal, which is output from the oscillator, on the basis of the phase difference. As a result, the phase of the output signal may be locked to that of the reference signal. According to an embodiment of the present disclosure, the PLL 611 outputs the output signal to the phase lock detection unit 630.

The phase lock detection unit 630 includes the first divider 631 that individually frequency-divides the reference signal and the output signal, the phase frequency detector 633 that outputs a first pulse signal and a second pulse signal each corresponding to a phase difference between the frequency-divided reference signal and the frequency-divided output signal, the second divider 635 that individually frequency-divides the first pulse signal and the second pulse signal, and the determiner 637 that determines whether the phase of the output signal is locked, on the basis of the frequency-divided first pulse signal and the frequency-divided second pulse signal.

The phase lock detection unit 630 may be included in the RF processing unit 610, and may also be included in an apparatus, such as a modem chip set, which may be included in the wireless communication device.

Specifically, each of the first divider 631 and the second divider 635 divides a frequency of a signal that is input to each of the first divider 631 and the second divider 635. The phase frequency detector 633 calculates a phase difference between signals which are input to the phase frequency detector 633, and generates a difference signal corresponding to the phase difference. The determiner 637 determines whether a signal which has been input to the phase lock detection unit 630 is frequency-locked.

In other words, the phase lock detection unit 630 includes the first divider 631 that individually frequency-divides the reference signal and the output signal, the phase frequency detector 633 that outputs a first pulse signal and a second pulse signal each corresponding to a phase difference between the frequency-divided reference signal and the frequency-divided output signal, the second divider 635 that individually frequency-divides the first pulse signal and the second pulse signal, and the determiner 637 that determines whether the phase of the output signal is locked, on the basis of the frequency-divided first pulse signal and the frequency-divided second pulse signal.

In FIG. 6, the reference signal and the output signal may be individually input to the first divider 631. For example, the reference signal may be generated by an oscillator, such as a TCXO having higher stability than the stability of other oscillators. The output signal includes a signal that is output from a VCO.

In FIG. 6, each of the first divider 631 and the second divider 635 refers to a circuit that divides a frequency in order to match a frequency of a high-speed circuit part with that of a low-speed circuit part. According to an embodiment of the present disclosure, the first divider 631 and the second divider 635 serve to reduce a frequency of the reference signal and a frequency of the output signal by a predetermined ratio in order to easily detect whether the phase of the output signal is locked to the phase of the reference signal.

The first divider 631 outputs the reference signal and the output signal, which are both input to the first divider 631, to the phase frequency detector 633. The frequency-divided reference signal, which is output from the first divider 631, has a wavelength that is twice as long as the wavelength of the reference signal which is input to the first divider 631.

Similarly, a frequency-divided output signal, which is output from the first divider 631, has a wavelength that is twice as long as the wavelength of the output signal which is input to the first divider 631. When a duty cycle of the output signal that is input to the first divider 631 does not reach 50%, the first divider 631 corrects the output signal such that the duty cycle of the output signal reaches 50%, and outputs the corrected output signal.

The phase frequency detector 633 outputs a first pulse signal and a second pulse signal each corresponding to a phase difference between the frequency-divided reference signal and the frequency-divided output signal. In other words, the phase frequency detector 633 quantifies the phase difference between the frequency-divided reference signal and the frequency-divided output signal, and outputs the first pulse signal and the second pulse signal each corresponding to the quantified phase difference.

The phase frequency detector 633 individually outputs, as references, the first pulse signal corresponding to a period during which the amplitude of the reference signal is higher than the amplitude of the output signal, at a time point when a phase difference between the reference signal and the output signal begins to exist, and the second pulse signal corresponding to a period during which the amplitude of the output signal is higher than the amplitude of the reference signal at the time point when the phase difference between the reference signal and the output signal begins to exist.

The second divider 635 frequency-divides the first pulse signal and the second pulse signal, which are input to the second divider 635, and outputs the frequency-divided first and second pulse signals to the determiner 637. The frequency-divided first pulse signal, which is output from the second divider 635, has a wavelength that is twice as long as the wavelength of the first pulse signal which is input to the second divider 635. When a duty cycle of the first pulse signal that is input to the second divider 635 does not reach 50%, the second divider 635 corrects the first pulse signal such that the duty cycle of the first pulse signal reaches 50%, and outputs the corrected first pulse signal.

The frequency-divided second pulse signal, which is output from the second divider 635, has a wavelength that is twice as long as the wavelength of the second pulse signal which is input to the second divider 635. When a duty cycle of the second pulse signal that is input to the second divider 635 does not reach 50%, the second divider 635 corrects the second pulse signal such that the duty cycle of the second pulse signal reaches 50%, and outputs the corrected second pulse signal.

The determiner 637 determines whether the phase of the output signal is locked, on the basis of the frequency-divided first pulse signal and the frequency-divided second pulse signal. In other words, the determiner 637 determines whether a phase difference exists between the frequency-divided first pulse signal and the frequency-divided second pulse signal. When the phase difference does not exist, the determiner 637 determines that the phase of the output signal has been locked to the phase of the reference signal. In contrast, when the phase difference exists, the determiner 637 determines that the phase of the output signal has not been locked to the phase of the reference signal.

Figure 7:
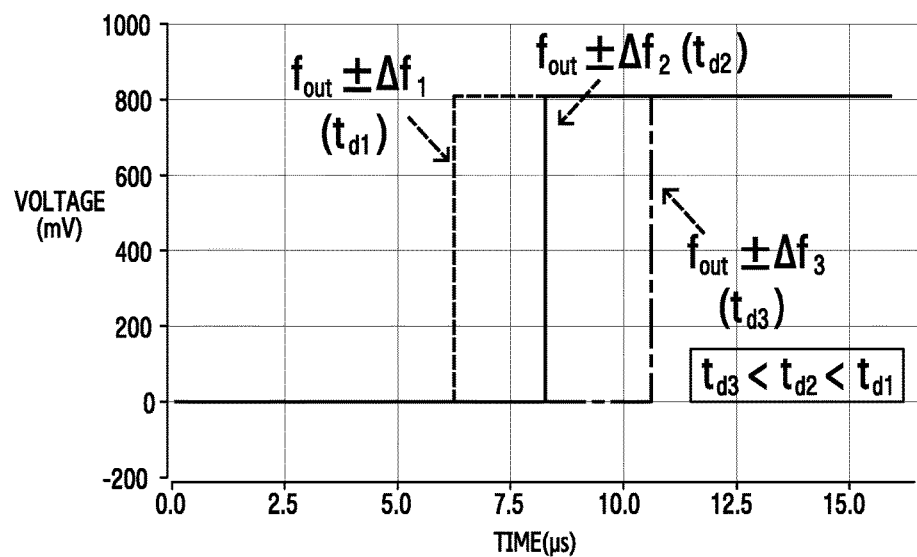
FIG. 7 is a graph illustrating an output of a phase lock detection apparatus according to an embodiment of the present disclosure.

FIG. 7 is a graph illustrating an output of a phase lock detection apparatus according to an embodiment of the present disclosure.

Referring back to FIG. 2, the first delay circuit 271 delays the signal UP4, which is input to the first delay circuit 271, and outputs the delayed signal to the CLK terminal of the second flip-flop 277. The second delay circuit 273 delays the signal DN4, which is input to the second delay circuit 273, and outputs the delayed signal to the CLK terminal of the first flip-flop 275.

The degree of delay of each of signal UP4 and signal DN4 changes according to the accuracy of a frequency of signal FD1 in FIG. 2. For example, when signal FD1 is output from a particular oscillator, an error may occur at the frequency of signal FD1, from such causes as temperature change or a change in a process or voltage. In other words, when an oscillation frequency intended by a user is equal to 836.5 MHz, due to the error from the aforementioned causes, a frequency which is output from the oscillator may be 832 MHz or 840.2 MHz.

Referring to FIG. 7, the value of $f_{out}$ corresponds to the oscillation frequency intended by the user, and $\Delta f_1$, $\Delta f_2$ and $\Delta f_3$ correspond to the errors which have occurred at the frequency $f_{out}$ from the aforementioned causes. In this case, the degree of delay of each of signal UP4 and signal DN4 may change according to $\Delta f_1$, $\Delta f_2$ and $\Delta f_3$.

Figure 8:
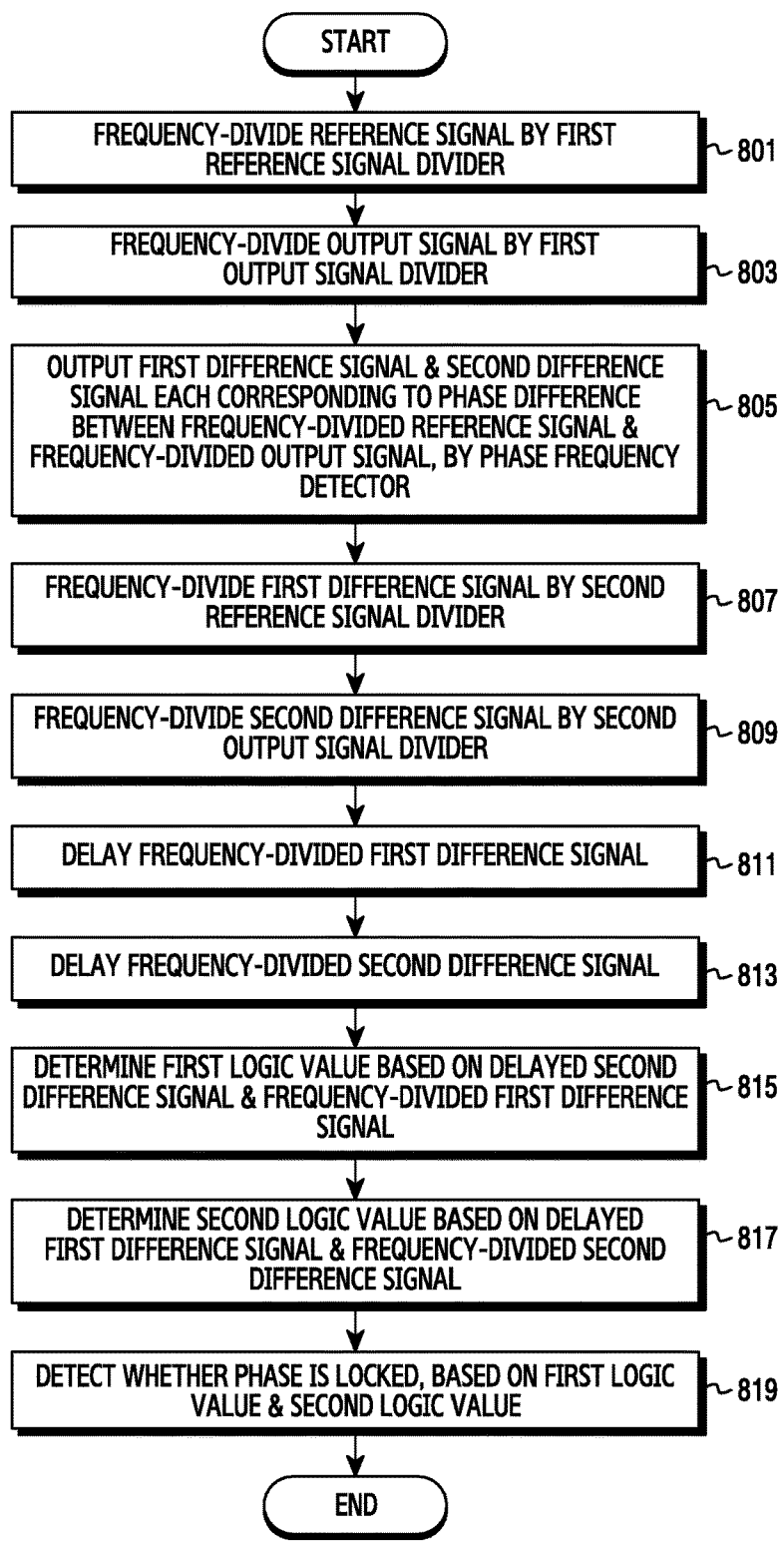
FIG. 8 illustrates an operation of a phase lock detection apparatus according to embodiments of the present disclosure.

FIG. 8 illustrates an operation of a phase lock detection apparatus according to embodiments of the present disclosure.

In step 801, the first reference signal divider 211 illustrated in FIG. 2 frequency-divides a reference signal, which corresponds to signal FR1 illustrated in FIG. 2, and particularly, may be a signal generated by an oscillator, such as a TCXO having higher stability than the stability of other oscillators.

In step 803, the first output signal divider 213 illustrated in FIG. 2 frequency-divides an output signal, which corresponds to signal FD1 illustrated in FIG. 2. Particularly, FD2 is the frequency-divided version of signal FD1, and may be used by the phase lock detection apparatus to determine whether a phase which is locked is detected. For example, the output signal includes a signal that is output from a VCO.

In step 805, the phase frequency detector 230 illustrated in FIG. 2 outputs a first difference signal and a second difference signal each corresponding to a phase difference between the frequency-divided reference signal and the frequency-divided output signal. In other words, the phase frequency detector 230 quantifies the phase difference between the frequency-divided reference signal and the frequency-divided output signal, and outputs a first difference signal and a second difference signal each corresponding to the quantified phase difference.

The phase frequency detector 230 individually outputs, as references, the first difference signal corresponding to a period during which the amplitude of the reference signal is higher than the amplitude of the output signal at a time point when a phase difference between the reference signal and the output signal begins to exist, as a reference, and the second difference signal corresponding to a period during which the amplitude of the output signal is higher than that of the reference signal at the time point when the phase difference between the reference signal and the output signal begins to exist.

In step 807, the second reference signal divider 251 illustrated in FIG. 2 frequency-divides the first difference signal. The frequency-divided first difference signal has a wavelength that is twice as long as the wavelength of the first difference signal. When a duty cycle of the first difference signal does not reach 50%, the second reference signal divider 251 corrects the first difference signal such that the duty cycle of the first difference signal reaches 50%, and outputs the corrected first difference signal.

In step 809, the second output signal divider 253 illustrated in FIG. 2 frequency-divides the second difference signal. The frequency-divided second difference signal has a wavelength that is twice as long as the wavelength of the second difference signal. When a duty cycle of the second difference signal does not reach 50%, the second output signal divider 253 corrects the second difference signal such that the duty cycle of the second difference signal reaches 50%, and outputs the corrected second difference signal.

In step 811, the first delay circuit 271 illustrated in FIG. 2 delays the frequency-divided first difference signal, which is input to the first delay circuit 271, and outputs the delayed signal to the CLK terminal of the second flip-flop 277. In other words, a signal which is output from the first delay circuit 271 serves as a clock signal of the second flip-flop 277.

In step 813, the second delay circuit 273 illustrated in FIG. 2 delays the frequency-divided second difference signal, which is input to the second delay circuit 273, and outputs the delayed signal to the CLK terminal of the first flip-flop 275. In other words, a signal which is output from the second delay circuit 273 serves as a clock signal of the first flip-flop 275.

In step 815, the first flip-flop 275 illustrated in FIG. 2 determines a first logic value on the basis of the delayed second difference signal and the frequency-divided first difference signal. In other words, the first flip-flop 275 outputs the value of the frequency-divided first difference signal that is input at a time point, with the time point, when the delayed second difference signal is input, as a reference.

In step 817, the second flip-flop 277 illustrated in FIG. 2 determines a second logic value on the basis of the delayed first difference signal and the frequency-divided second difference signal. In other words, the second flip-flop 277 outputs the value of the frequency-divided second difference signal that is input at a time point, with the time point, when the delayed first difference signal is input, as a reference.

In step 819, the AND gate 279 illustrated in FIG. 2 detects whether a phase is locked, on the basis of the first logic value and the second logic value. In other words, the AND gate 279 is an element that causes an output to become a logic state of 1 only when inputs are all in a logic state of 1. According to an embodiment of the present disclosure, when the first logic value and the second logic value both become 1, a logic value of a signal, which is output from the AND gate 279, may be determined as 1. In this case, the phase lock detection apparatus determines that the phase of the output signal has been locked to the phase of the reference signal.

Figure 9:
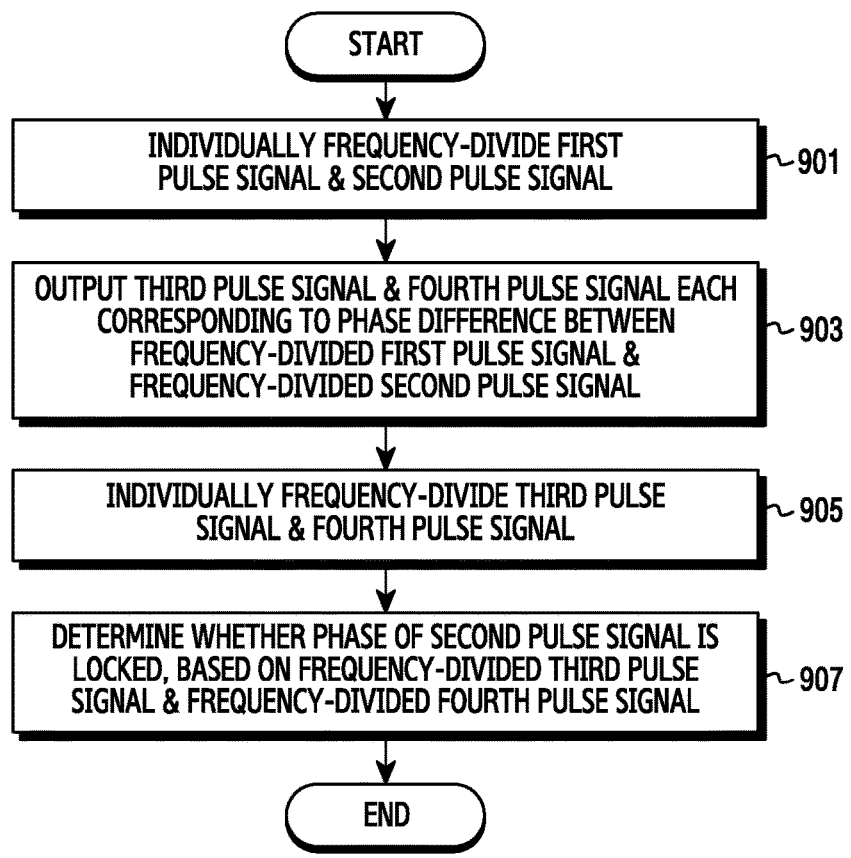
FIG. 9 illustrates an operation of a phase lock detection apparatus according to embodiments of the present disclosure.

FIG. 9 illustrates an operation of a phase lock detection apparatus according to embodiments of the present disclosure.

In step 901, the first divider 110 illustrated in FIG. 1 individually frequency-divides a first pulse signal and a second pulse signal that are input the first divider 110. The first pulse signal is referred to herein as a "reference signal." The reference signal may be generated by an oscillator, such as a TCXO having higher stability than the stability of other oscillators. The second pulse signal may be used to determine whether the phase lock detection apparatus detects a phase lock. For example, the second pulse signal includes a signal that is output from a VCO.

The first divider 110 serves to reduce a frequency of the first pulse signal and the frequency of the second pulse signal by a predetermined ratio in order to easily detect whether a phase of the second pulse signal is locked to the phase of the first pulse signal. As a result, a first pulse signal, which is output from the first divider 110, has a wavelength that is twice as long as that the wavelength of a first pulse signal that is input to the first divider 110.

Similarly, a second pulse signal, which is output from the first divider 110, has a wavelength that is twice as long as the wavelength of a second pulse signal which is input to the first divider 110. When a duty cycle of the second pulse signal that is input to the first divider 110 does not reach 50%, the first divider 110 corrects the second pulse signal such that the duty cycle of the second pulse signal reaches 50%, and outputs the corrected second pulse signal.

In step 903, the phase frequency detector 130 illustrated in FIG. 1 outputs a third pulse signal and a fourth pulse signal each corresponding to a phase difference between the frequency-divided first pulse signal and the frequency-divided second pulse signal. The phase frequency detector 130 individually outputs, as references, the third pulse signal corresponding to a period during which the amplitude of the first pulse signal is higher than the amplitude of the second pulse signal, at a time point when a phase difference between the first pulse signal and the second pulse signal begins to exist, and the fourth pulse signal corresponding to a period during which the amplitude of the second pulse signal is higher than the amplitude of the first pulse signal, at the time point when the phase difference between the first pulse signal and the second pulse signal begins to exist.

In step 905, the second divider 150 illustrated in FIG. 1 individually frequency-divides the third pulse signal and the fourth pulse signal. The frequency-divided third pulse signal, which is output from the second divider 150, has a wavelength that is twice as long as the wavelength of the third pulse signal which is input to the second divider 150. When a duty cycle of the third pulse signal that is input to the second divider 150 does not reach 50%, the second divider 150 corrects the third pulse signal such that the duty cycle of the third pulse signal reaches 50%, and outputs the corrected third pulse signal.

The frequency-divided fourth pulse signal, which is output from the second divider 150, has a wavelength that is twice as long as the wavelength of the fourth pulse signal which is input to the second divider 150. When a duty cycle of the fourth pulse signal that is input to the second divider 150 does not reach 50%, the second divider 150 corrects the fourth pulse signal such that the duty cycle of the fourth pulse signal reaches 50%, and outputs the corrected fourth pulse signal.

In step 907, the determiner 170 illustrated in FIG. 1 determines whether the phase of the second pulse signal is locked, on the basis of the frequency-divided third pulse signal and the frequency-divided fourth pulse signal. In other words, the determiner 170 determines whether a phase difference exists between the frequency-divided third pulse signal and the frequency-divided fourth pulse signal. When the phase difference does not exist, the determiner 170 determines that the phase of the second pulse signal has been locked to the phase of the first pulse signal. In contrast, when the phase difference exists, the determiner 170 determines that the phase of the second pulse signal has not been locked to the phase of the first pulse signal.

The methods according to embodiments of the present disclosure as defined by the appended claims or disclosed herein may be implemented in the form of hardware, software, or any combination of hardware and software.

In the implementation of software, a computer-readable storage medium for storing one or more programs (software modules) may be provided. The at least one program stored in the computer-readable storage medium is configured to be executable by one or more processors in an electronic device, and includes instructions that cause the electronic device to perform the methods according to embodiments of the present disclosure as defined by the appended claims and/or disclosed herein.

The programs (software modules or software) may be stored in non-volatile memories including a random access memory and a flash memory, a Read Only Memory (ROM), an Electrically Erasable Programmable Read Only Memory (EEPROM), a magnetic disc storage device, a Compact Disc-ROM (CD-ROM), Digital Versatile Discs (DVDs), or other type optical storage devices, or a magnetic cassette. Alternatively, any combination of some or all of the may form a memory in which the program is stored. Further, a plurality of such memories may be included in the electronic device.

In addition, the programs may be stored in an attachable storage device which may access the electronic device through communication networks such as the Internet, Intranet, Local Area Network (LAN), Wide LAN (WLAN), and Storage Area Network (SAN) or a combination thereof. Such a storage device may access a device for performing embodiments of the present disclosure via an external port. Further, a separate storage device on the communication network may access a device for performing embodiments of the present disclosure.

In the above-described specific embodiments of the present disclosure, an element included in the disclosure has been expressed in a singular or plural form according to the proposed specific embodiment. However, the singular or plural expression is selected appropriately for convenience of description, and thus the present disclosure is not limited to a single or a plurality of elements. Therefore, an element expressed in a plural form may be expressed in a singular form, or vice versa.

While the present disclosure has been shown and described with reference to certain embodiments thereof, it will be understood by those skilled in the art that various changes in form and details may be made therein without departing from the scope of the present disclosure. Therefore, the scope of the present disclosure should not be defined as being limited to the embodiments, but should be defined by the appended claims and equivalents thereof.

What is claimed is:

1. An apparatus for detecting phase lock in an electronic device, the apparatus comprising:
   a first divider configured to:
      output a first pulse signal by frequency-dividing a reference signal; and
      output a second pulse signal by frequency-dividing an input signal and correcting the input signal such that a duty cycle of the input signal reaches a duty cycle of the reference signal;
   a phase frequency detector configured to output a third pulse signal and a fourth pulse signal based on a phase difference between the first pulse signal and the second pulse signal;
   a second divider configured to:
      output a fifth pulse signal by frequency-dividing the third pulse signal and correcting the third pulse signal such that a duty cycle of the third pulse signal reaches a certain value if the duty cycle of the third pulse signal does not reach the certain value; and
      output a sixth pulse signal by frequency-dividing the fourth pulse signal and correcting the fourth pulse signal such that a duty cycle of the fourth pulse signal reaches the certain value if the duty cycle of the fourth pulse signal does not reach the certain value; and
   a determiner configured to:
      delay the fifth pulse signal and the sixth pulse signal; and
      determine whether a phase of the input signal is locked to match the phase of the reference signal, based on the fifth pulse signal and the sixth pulse signal,
   wherein a pulse width of the fifth pulse signal is greater than or equal to a pulse width of the third pulse signal, and a pulse width of the sixth pulse signal is greater than or equal to a pulse width of the fourth pulse signal, and
   wherein the second divider is connected between the phase frequency detector and the determiner.

2. The apparatus of claim 1,
   wherein the fifth pulse signal and the sixth pulse signal are delayed by a time period determined according to an error regarding an oscillation frequency of the input signal.

3. The apparatus of claim 2,
   wherein the reference signal becomes a reference in detecting whether the phase of the input signal is locked and is generated by a first oscillator for providing higher stability than a second oscillator, and
   wherein the input signal includes an output signal that is output from the second oscillator and passes through a phase-locked loop.

4. The apparatus of claim 3, wherein the phase frequency detector is configured to:
   output the third pulse signal corresponding to the phase difference with respect to the first pulse signal; and
   output the fourth pulse signal corresponding to the phase difference with respect to the second pulse signal;
   wherein the first divider comprises:
      a first reference divider that frequency-divides the reference signal to output the first pulse signal; and
      a first output divider that frequency-divides the input signal to output the second pulse signal, and
   wherein the second divider comprises:
      a second reference divider that frequency-divides the third pulse signal to output the fifth pulse signal; and
      a second output divider that frequency-divides the fourth pulse signal to output the sixth pulse signal.

5. The apparatus of claim 2, wherein the determiner comprises:
   a first delay circuit that delays the fifth pulse signal by the time period;
   a second delay circuit that delays the sixth pulse signal by the time period;
   a first determiner configured to determine a first logic value based on the delayed sixth pulse signal and the fifth pulse signal;
   a second determiner configured to determine a second logic value based on the delayed fifth pulse signal and the sixth pulse signal; and
   a third determiner configured to determine whether the phase of the input signal is locked to match the phase of the first pulse signal, based on the first logic value and the second logic value.

6. The apparatus of claim 2,
wherein the error is a difference between the oscillation frequency of the input signal and a reference oscillation frequency set by a user.

7. The apparatus of claim 2,
wherein the certain value is identical to the duty cycle of the reference signal.

8. The apparatus of claim 7,
wherein the duty cycle of the reference signal is substantially 50-percent (%), and
wherein the certain value is substantially 50%.

9. A method for detecting phase lock, the method comprising:
outputting, by a first divider, a first pulse signal by frequency-dividing a reference signal;
outputting, by the first divider, a second pulse signal by frequency-dividing an input signal and correcting the input signal such that a duty cycle of the input signal reaches a duty cycle of the reference signal;
outputting, by a phase frequency detector, a third pulse signal and a fourth pulse signal based on a phase difference between the first pulse signal and the second pulse signal;
outputting, by a second divider, a fifth pulse signal by frequency-dividing the third pulse signal and correcting the third pulse signal such that a duty cycle of the third pulse signal reaches a certain value if the duty cycle of the third pulse signal does not reach the certain value;
outputting, by the second divider, a sixth pulse signal by frequency-dividing the fourth pulse signal and correcting the fourth pulse signal such that a duty cycle of the fourth pulse signal reaches the certain value if the duty cycle of the fourth pulse signal does not reach the certain value;
delaying, by a determiner, the fifth pulse signal and the sixth pulse signal; and
determining, by the determiner, whether a phase of the input signal is locked to match the phase of the reference pulse signal, based on the fifth pulse signal and the sixth pulse signal,
wherein a pulse width of the fifth pulse signal is greater than or equal to a pulse width of the third pulse signal, and a pulse width of the sixth pulse signal is greater than or equal to a pulse width of the fourth pulse signal, and
wherein the second divider is connected between the phase frequency detector and the determiner.

10. The method of claim 9,
wherein the fifth pulse signal and the sixth pulse signal are delayed by a time period determined according to an error regarding an oscillation frequency of the input signal.

11. The method of claim 10, wherein the reference signal that becomes a reference in detecting whether the phase of the input signal is locked is generated by a first oscillator for providing higher stability than a second oscillator, and
wherein the input signal that is output from the second oscillator and passes a phase-locked loop.

12. The method of claim 11,
wherein outputting the third signal and the fourth pulse signal comprises:
outputting the third pulse signal corresponding to the phase difference with respect to the first pulse signal; and outputting the fourth pulse signal corresponding to the phase difference with respect to the second pulse signal,
wherein delaying the fifth pulse signal and the sixth pulse signal comprises:
delaying the fifth pulse signal by the time period; and
delaying the sixth pulse signal by the time period, and
wherein determining whether the phase of the input signal is locked comprises:
determining a first logic value based on the delayed sixth pulse signal and the fifth pulse signal;
determining a second logic value based on the delayed fifth pulse signal and the sixth pulse signal; and
determining whether the phase of the input signal is locked to match the phase of the reference signal, based on the first logic value and the second logic value.

13. The method of claim 10,
wherein the certain value is identical to the duty cycle of the reference signal.

14. The method of claim 13,
wherein the duty cycle of the reference signal is substantially 50-percent (%), and
wherein the certain value is substantially 50%.

15. A chip set, comprising:
a radio frequency processing unit that includes a phase-locked loop (PLL); and
a phase lock detection unit that detects whether a phase of an output signal of the PLL is locked to match a phase of a reference signal,
wherein the phase lock detection unit comprises:
a first divider that outputs a first pulse signal by frequency-dividing the reference signal and outputs a second pulse signal by frequency-dividing the output signal and correcting the output signal such that a duty cycle of the output signal reaches a duty cycle of the reference signal;
a phase frequency detector that outputs a third pulse signal and a fourth pulse signal based on a phase difference between the first pulse signal and the second pulse signal;
a second divider that outputs a fifth pulse signal by frequency-dividing the third pulse signal and correcting the third pulse signal such that a duty cycle of the third pulse signal reaches a certain value if the duty cycle of the third pulse signal does not reach the certain value, and outputs a sixth pulse signal by frequency-dividing the fourth pulse signal and correcting the fourth pulse signal such that a duty cycle of the fourth pulse signal reaches the certain value if the duty cycle of the fourth pulse signal does not reach the certain value; and
a determiner that delays the fifth pulse signal and the sixth pulse signal and determines whether the phase of the output signal is locked, based on the fifth pulse signal and the sixth pulse signal,
wherein a pulse width of the fifth pulse signal is greater than or equal to a pulse width of the third pulse signal, and a pulse width of the sixth pulse signal is greater than or equal to a pulse width of the fourth pulse signal, and
wherein the second divider is connected between the phase frequency detector and the determiner.

16. The chip set of claim 15,
wherein the fifth pulse signal and the sixth pulse signal are delayed by a time period determined according to an error regarding an oscillation frequency of the input signal.

17. The chip set of claim 16, wherein the first divider comprises:

a first reference divider that frequency-divides the reference signal; and a first output divider that frequency-divides the output signal, and wherein the second divider comprises:

a second reference divider that frequency-divides the third pulse signal; and a second output divider that frequency-divides the fourth pulse signal.

18. The chip set of claim 17, wherein the determiner comprises:

a first delay circuit that delays the fifth pulse signal by the time period;

a second delay circuit that delays the sixth pulse signal by the time period;

a first determiner that determines a first logic value based on the delayed sixth pulse signal and the fifth pulse signal;

a second determiner that determines a second logic value based on the delayed fifth pulse signal and the frequency-divided sixth pulse signal; and a third determiner that determines whether the phase of the output signal is locked to match the phase of the reference signal, based on the first logic value and the second logic value.

19. The chip set of claim 16, wherein the certain value is identical to the duty cycle of the reference signal.

20. The chip set of claim 19, wherein the duty cycle of the reference signal is substantially 50-percent (%), and wherein the certain value is substantially 50%.

\* \* \* \* \*